United States Patent [19]

Suzuki et al.

[11] Patent Number: 4,700,458

[45] Date of Patent: Oct. 20, 1987

[54] METHOD OF MANUFACTURE THIN FILM TRANSISTOR

[75] Inventors: Kouji Suzuki; Mitsushi Ikeda, both of Yokohama; Toshio Aoki, Hiratsuka, all of Japan

[73] Assignee: Tokyo Shibaura Denki Kabushiki Kaisha, Kawasaki, Japan

[21] Appl. No.: 779,648

[22] Filed: Sep. 24, 1985

Related U.S. Application Data

[62] Division of Ser. No. 400,357, Jul. 21, 1982, abandoned.

[30] Foreign Application Priority Data

Jul. 27, 1981 [JP] Japan ................................ 56-117423
Mar. 31, 1982 [JP] Japan ................................ 57-51421

[51] Int. Cl.⁴ .......................................... H01L 21/312
[52] U.S. Cl. ............................ 437/83; 148/DIG. 106; 437/84; 437/41
[58] Field of Search .................... 29/571, 576 B, 578; 148/DIG. 105, DIG. 106; 357/23.7, 41; 427/88, 93, 95, 108

[56] References Cited

U.S. PATENT DOCUMENTS

| | | | |
|---|---|---|---|
| 4,049,963 | 9/1977 | Kuehnle | 357/30 X |
| 4,065,781 | 12/1977 | Gutknecht | 357/23.7 |
| 4,174,217 | 11/1979 | Flatley | 148/187 |
| 4,393,572 | 7/1983 | Policastro et al. | 357/23.7 |
| 4,459,739 | 7/1984 | Sheperd et al. | 357/23.7 |

FOREIGN PATENT DOCUMENTS 90661 5/1983 European Pat. Off. ........... 357/23.7
1071576 6/1967 Netherlands .

OTHER PUBLICATIONS

Fowler, "Ion Implanted Inverted TFT", IBM Tech. Dicl. Bulletin, vol. 12, #12, 5/70.
Hayama et al, "Amorphous-Silicon Thin-Film Metal-Oxide-Semiconductor Transistors", Appl. Phys. Lett., 36(9), May 1, 1980.
Kallfass et al, "High Voltage . . . ", in Thin Solid Films, vol. 61, No. 2, 8/1979, pp. 259–264.

*Primary Examiner*—Brian E. Hearn
*Assistant Examiner*—T. N. Quach
*Attorney, Agent, or Firm*—Oblon, Fisher, Spivak, McClelland & Maier

[57] ABSTRACT

A method for manufacturing thin-film transistor comprises steps of sequentially forming in laminar state a gate film, an insulating film and a conductive film having a transparent electrode film and an amorphous silicon film added with an impurity thereto on the top surface of glass substrate or layer; irradiating ultraviolet ray from the bottom surface side of the substrate to expose negative photoresist film on said conductive film and to etch the same; and forming an amorphous semiconductive film on the structure. In this manner, source and drain electrodes are respectively self-aligned with the gate electrode and contacted therewith through a semiconductive film and a low resistive and semiconductor film.

16 Claims, 13 Drawing Figures

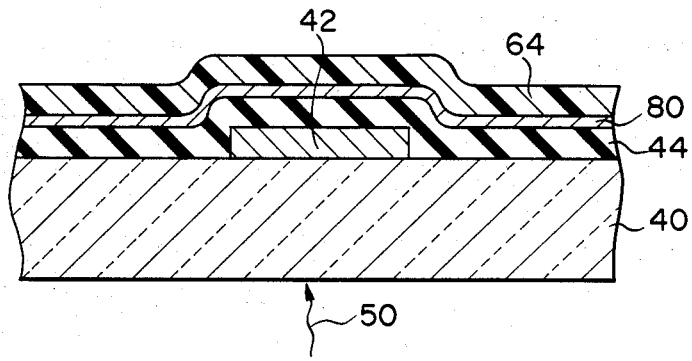
F I G. 5A
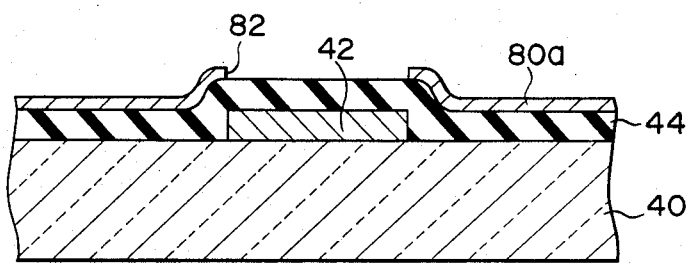
F I G. 5B
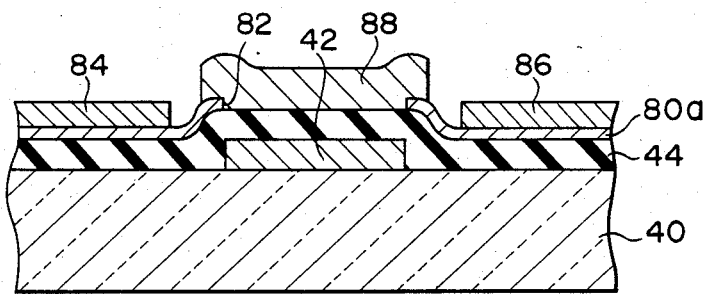
F I G. 5C

METHOD OF MANUFACTURE THIN FILM TRANSISTOR

This is a division of application Ser. No. 400,357, filed July 21, 1982, abandoned.

BACKGROUND OF THE INVENTION

The present invention relates to a method for manufacturing field-effect transistors constructed entirely by thin-film techniques. The invention also relates to a field-effect transistor constructed entirely by thin-film techniques.

A realization of thin-film integrated circuits has recently been required as it has been one of important subject matters to fabricate a transistor by the thin-film techniques. The transistor of this type is known as a thin-film transistor (TFT) and functions as a switching element or active circuit element in the above thin-film integrated circuit. In case that a thin-film formed of a semiconductor material is formed at a relatively low temperature on the top surface of a substrate, the material for the substrate has a large selection, and a thin-film IC pattern forming method is known to have such advantages that the pattern can be readily formed in accordance with conventional exposure techniques and etching techniques.

Since the TFT is commonly formed on the top surface of the substrate with polycrystalline semiconductor or amorphous semiconductor material, the carrier mobility thereof becomes lower than that of the single crystalline semiconductor material. This is particularly remarkable in the TFT formed with amorphous semiconductor material. Therefore, the TFT formed with polycrystalline or amorphous semiconductor material has considerably narrow operation frequency range as compared with that of the ordinary MOSFET. Further, the operation frequency range of the TFT is narrowed and the operating speed is undesirably lowered by the adverse influence of the storage capacitance or parasitic capacitance produced in a transistor structure and the wiring pattern formed on the substrate.

SUMMARY OF THE INVENTION

It is an object of the present invention to provide a new and improved method for readily manufacturing thin-film transistors which have preferable operating characteristics in a wide operation frequency range and which contribute to the improvements in the integration of thin-film circuits formed in microminiaturization.

It is another object of the present invention to provide a new and improved thin-film transistor which has preferable operating characteristics in a wide operation frequency range and which contributes to the improvements in the integration of thin-film circuits formed in microminiaturization.

According to a method for manufacturing a thin-film transistor of the present invention, a first electrically conductive film is formed on the first surface of an electrically insulative substrate which permits the transmission of radiation. The first film prevents the transmission of the radiation. Subsequently, a second electrically insulative film and a third electrically conductive film which permits the transmission of radiation are sequentially formed so as to make a laminar structure on the above first surface of the substrate and on the first film. A negative photoresist film formed on the third film is exposed with the first film as a mask by introducing radiation from the second surface side confronting the first surface of the substrate. Thereafter, an etching treatment is performed to form an electrically conductive film pattern. The film pattern has an opening of the shape substantially equal to the profile of the first film. Subsequently, a fourth semiconductive film is formed on a predetermined region including the opening on the top surface of the structure formed as described above.

Since the opening of the film pattern is accurately equal to the profile of the first film serving as a gate electrode for the thin-film transistor, source and drain electrodes thereof are self-aligned with the gate electrode. Accordingly, an overlapping of the source and drain electrodes does not substantially occur, and the existence of storage capacitance or parasitic capacitance therebetween can be prevented to minimum. Since the negative photoresist film is further applied in the exposure, it is not necessary to employ a lift-off technique or lift-away technique in the step of forming the electrically conductive film pattern to be formed in the source and drain electrodes of the thin-film transistor. In this manner, the above described another object of the present invention can be performed

BRIEF DESCRIPTION OF THE DRAWINGS

This invention is best understood by reference to the accompanying drawings of which:

FIGS. 5A to 5C illustrate, in schematic cross-section, some of major steps in the process of a method for manufacturing a thin-film transistor in accordance with modified example of the embodiment of FIG. 4 of the present invention.

DETAILED DESCRIPTION OF THE PREFERRED EMBODIMENTS

Figure 1:
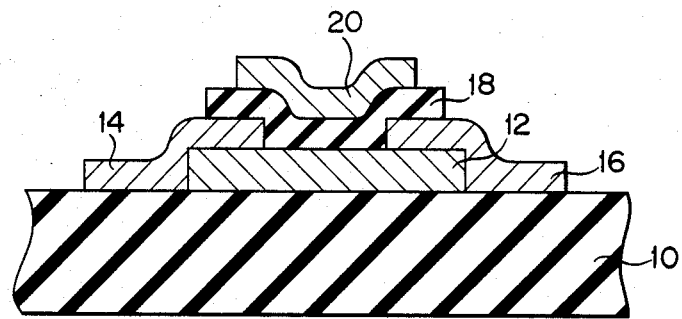
FIG. 1 is a schematic cross-sectional view of a thin-film transistor of the prior art.

Referring to the schematic diagram of FIG. 1, there is illustrated a prior art thin-film transistor constructed on the top surface of substrate 10 made of an electrically insulating or isolating material. The thin-film transistor (TFT) of FIG. 1 includes a thin-film 12 which is made of either polycrystalline or amorphous semiconductor material, source and drain electrodes 14 and 16 made of metal thin-film, an insulating film 18 and a gate electrode 20 of metal thin-film. The gate electrode 20 is electrically isolated from the thin-film 12 and the source and drain electrodes 14 and 16 via the insulating film 18.

Figure 2:
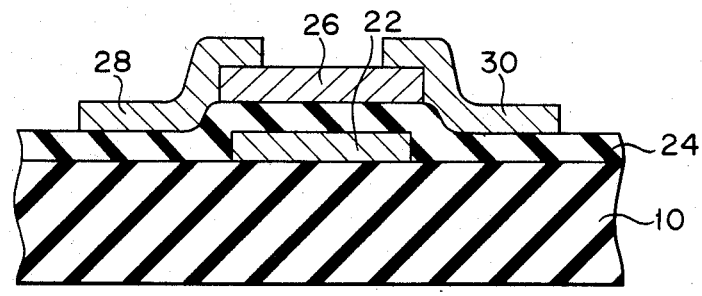
FIG. 2 is a schematic cross-sectional view of another thin-film transistor of the prior art.

Referring also to the schematic diagram of FIG. 2, there is shown another TFT of the prior art. The TFT of FIG. 2 includes a gate electrode 22 which is made of metal material and formed on the top surface of the substrate 10. An insulating film 24 is overlaid to cover the substrate 10 and the gate electrode 22. In this embodiment, on the insulating film 24 are sequentially formed a thin-film 26 of either polycrystalline or amorphous semiconductor material, and source and drain electrodes 28 and 30 of metal material.

According to the conventional method for manufacturing the TFT of FIG. 2, the formation of a thin-film is carried out by forming a gate electrode 22, a gate insulating film 24, a semiconductive thin-film 26 and source and drain electrodes 28 and 30 in the sequence on the above insulating substrate 10. This formation of the thin-film is performed in accordance with a known thin-film technique such as a deposition method. In this case, when a photoresist is exposed to form the source and drain electrodes 28 and 30, a light such as ultraviolet ray is incident from the top surface side of the substrate 10 to be formed with a TFT. The source and drain electrodes 28 and 30 thus formed by the known photo-etching process after the exposure step are overlapped with a part of the gate electrode 22 above the gate electrode. Since the TFT of FIG. 1 is also manufactured similarly to the TFT of FIG. 2, the source and drain electrodes 14 and 16 of the TFT of FIG. 1 are overlapped with the gate electrode 20 with one another.

The operation of the FETs of FIGS. 1 and 2 is substantially similar to the operation of the ordinary metal-oxide semiconductor field-effect transistor (MOSFET), and a current flowing through the semiconductor thin-film between the source and drain electrodes is controlled by a voltage applied to the gate electrodes. In the TFTs of FIGS. 1 and 2 and the ordinary MOSFET, the conducting state of their channels is carried out by the transfer of the semiconductor surface due to its field-effect or the storage of carrier. The fundamental difference between the operation of the TFTs of FIGS. 1 and 2 and the operation of the ordinary MOSFET resides in that the interrupting operation of the transistor depends upon the reverse bias characteristics of the P-N junction in the MOSFET while the operation of the TFTs of FIGS. 1 and 2 depends upon the high resistance characteristics of the semiconductor thin-films 12 and 26. Therefore, it is required in the TFTs that the resistance of the semiconductor thin-film in nonconductive state should be sufficiently larger than that at the conductive time and hence at the channel forming time.

Since the aforementioned TFTs each have the thin-films 12 and 26 made of polycrystalline or amorphous semiconductor material functioning as the channel formation unit, the mobility of the carriers such as electrons (or holes) substantially becomes lower than the carrier mobility of the FET made of single-crystal semiconductor material. Particularly, the TFT made of amorphous semiconductor material has lower carrier mobility. Therefore, the operation frequency band of the TFTs of FIGS. 1 and 2 becomes narrow and its operating speed becomes decelerated. Further, in case that a plurality of TFTs are integrated and arranged on the top surface of the substrate 10 for the purpose of forming the thin-film circuits, the operating speed of the thin-film circuit including the FETs further becomes lower. Because it is affected by the adverse influence of the parasitic capacitance on the basis of the transistor structure in addition to undesired storage capacitance or parasitic capacitance produced in the wiring pattern on the substrate 10. Since the substrate 10 made of insulative glass material is used for the TFTs of FIGS. 1 and 2 as described above, it is relatively easy to reduce the parasitic capacitance between the wiring pattern and the substrate 10. Since the source and drain electrodes of TFTs formed by the conventional manufacturing method as shown in FIGS. 1 and 2, however, extend to overlay a part of the gate electrode, the parasitic capacitances between the source and the gate and between the drain and the gate are relatively large. Accordingly, the adverse influence of the parasitic capacitances of these types is large, the operation frequency band of the thin-film circuit including the TFTs thus becomes narrow, and its operating speed is remarkably lowered.

It is considered as a method of overcoming the above described disadvantage to lower the resistance of the TFTs included in the thin-film circuit in the conductive state. However, it is necessary to set the width of the current path of the TFTs of FIGS. 1 and 2 and hence the channel width large for that purpose. As a consequence, since the parasitic capacitance based on the transistor structure increases proportionally to the increase in the channel width, the operating speed of the thin-film circuit cannot be substantially improved.

Figure 3A:
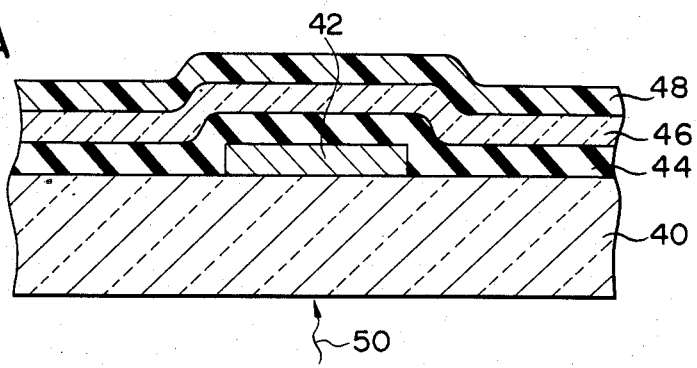
FIGS. 3A to 3D illustrate, in schematic cross-section, some of the major steps in the process of a method for manufacturing a thin-film transistor in accordance with one preferred embodiment of the present invention.

The above-mentioned problem is solved in the present invention by a method as one embodiment of the invention for manufacturing TFTs as will be described with reference to FIGS. 3A to 3D. A substrate 40 applied to the present invention is made of a transparent and electrically insulative material, e.g., glass material. In FIG. 3A, on the top surface of the glass substrate or layer 40 is formed a metal thin-film 42 having a predetermined pattern. The thin-film 42 is made, for example, of aluminum and is covered on the substrate 40 to include a thickness of approx. 1,000 Å. The Al thin-film 42 is formed by the known exposure techniques and etching techniques. On the substrate 40 and the Al thin-film 42 is deposited an insulating thin-film 44 made of an electrically insulative material such as silicon dioxide, for example, by sputtering. Subsequently, on the top surface of the above-mentioned insulating film 44 is deposited by sputtering a conductive thin-film 46 having a predetermined thickness such as preferably approx 2,000 Å and made of a transparent and electrically conductive material. On the conductive thin-film 46 is further coated a negative photoresist material to maintain a predetermined thickness such as approx. 1.5 μm thick to form a negative photoresist film 48.

Figure 3B:
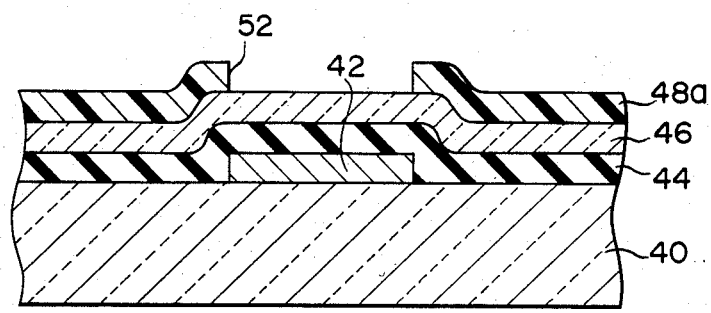

A light such as ultraviolet ray 50 is illuminated to the structure of FIG. 3A from the bottom surface side of the transparent substrate 40. Accordingly, the negative photoresist film 48 is exposed with the light 50 with the metal thin-film 42 formed on the top surface of the substrate 40 as a mask pattern. Thereafter, when the above-mentioned structure is developed, the part exposed with the above-mentioned ultraviolet beam 50 through the transparent substrate 40, insulating film 44 and transparent conductive thin-film 46 of the negative photoresist film 48 is polymerized to become non-soluble in a solvent, and accordingly remains on the thin-film 46 as a resist pattern 48a as shown in FIG. 3B. On the other hand, the part interrupted from the ultraviolet ray 50 by the metal thin-film 42 of the negative photoresist film 48 is dissolved in a solvent to form an opening 52 as shown in FIG. 3B. The shape of the opening 52 precisely corresponds to the profile of the metal thin-film 42.

Figure 3C:
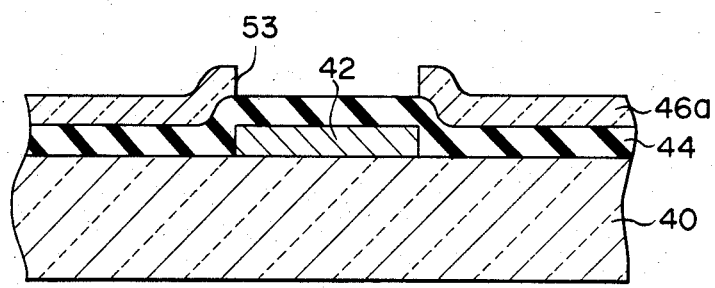

Then, with the resist pattern 48a thus obtained as shown in FIG. 3B as a mask the underlying conductive thin-film 46 is etched to form an electrode film 46a. An opening 53 formed in the electrode film 46a has a shape accurately corresponding to the profile of the metal thin-film 42. The structure of this state is illustrated in FIG. 3C.

Figure 3D:
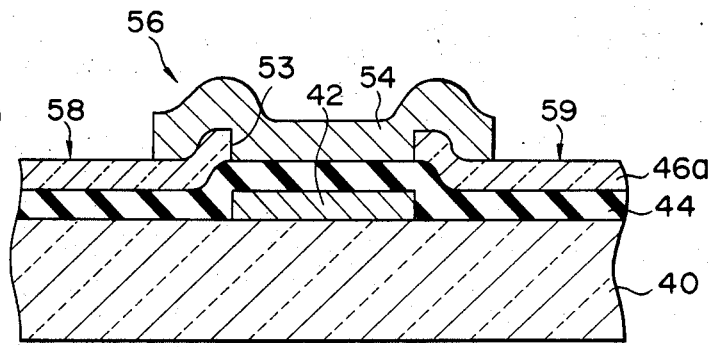

Subsequently, the semiconductive thin-film made of polycrystalline or amorphous semiconductor material in this embodiment is deposited by a glow discharge decomposition method of SiH₄, for example. The semiconductive thin-film is deposited on the top surface of the substrate of FIG. 3C to have a predetermined thickness, preferably approx. 6,000 Å. Thereafter, the above-mentioned structure having the semiconductive thin-film is patterned by the known PEP technique to form a semiconductive thin-film 54 as shown in FIG. 3D. Then, a wiring pattern is formed by the known method to complete the TFT 56. At this time, the metal thin-film 42 corresponds to the gate electrode of the TFT 56, and the transparent conductive thin-film 46a has portions 58 and 59 respectively corresponding to the source and drain electrodes of the TFT 56.

According to the method for manufacturing TFTs as one embodiment of the present invention, the TFT 57 which can effectively prevent the source and drain electrodes 58 and 59 of the TFT 56 from extending in the approaching direction to one another to overlap the underlying gate electrode 42 above the gate electrode 42, can be manufactured. In other words, the TFT 56 in which the source and drain electrodes 58 and 59 accurately self-align with the gate electrode 42, can be manufactured. The elimination of the overlapping of the source and drain electrodes 58 and 59 with the gate electrode 42 causes to minimize the storage or parasitic capacitance of the transistor structure. Therefore, the upper limit of the operation frequency of the thin-film circuit including a plurality of TFTs can be enlarged and improved as well as the operating speed can be improved.

Further, according to the above-mentioned embodiment of the present invention, in the formation of the resist pattern 48a to form the source and drain electrodes 58 and 59 of the TFT 56, the negative photoresist material for the photoresist film 48 should be selected. In this manner, the resist pattern 48a remains on the necessary regions to become thereafter the source and drain electrodes 58 and 59 of the transparent conductive thin-film 46. Therefore, the lift-off method or lift-away method is not necessary to form the source and drain electrodes 58 and 59 by removing the unnecessary region part of the conductive thin-film 46. It is therefore essentially necessary to determine the thickness of a resist film and metal film and to set any particulars of the resist film, both of which are important in the lift-off method. Accordingly, the TFTs having the above-mentioned effective characteristics can be manufactured readily with good yield, and the microminiaturization of the TFTs can be accelerated. Therefore, the integration of the thin-film circuit including such the TFTs can be improved.

Figure 4A:
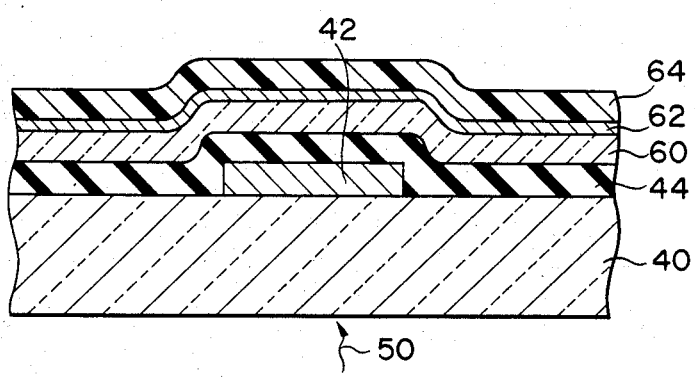
FIGS. 4A to 4D illustrate, in schematic cross-section, some of the major steps in the process of a method for manufacturing a thin-film transistor in accordance with another embodiment of the present invention.

The method for manufacturing the TFTs as another preferred embodiment of the present invention will now be described with reference to FIGS. 4A to 4D. In FIG. 4A, a metal thin-film 42 functioning as a gate electrode is formed on a glass substrate or layer 40, an insulating thin-film 44 made of silicon dioxide is then deposited in a predetermined thickness, e.g., 3,000 Å. Further, on the insulating thin-film 44 is deposited by sputtering a thin-film 60 which is made of a transparent and electrically conductive material such as indium-tin-oxide (ITO) in a predetermined thickness, e.g., preferably approx. 1,000 Å thick. Subsequently, an amorphous silicon thin-film 62 to which an impurity, e.g., phosphorus is added at a ratio of $10^{19}$ to $5 \times 10^{21}$/cm³ by a glow discharge decomposition method of SiH₄ and PH₃, is deposited on the above-mentioned ITO film 60. The amorphous silicon thin-film 62 is formed in a thickness of approx. 30 to 1,000 Å, preferably approx. 200 Å thickness. Subsequently, a negative photoresist material (e.g., a negative resist "OMR-83" manufactured and sold by Tokyo Ohka Industrial Company, Tokyo, Japan) 64 is coated in a predetermined thickness, e.g., approx. 0.5 μm on the top surface of the above-mentioned structure to provide a negative photoresist film 64.

Figure 4B:
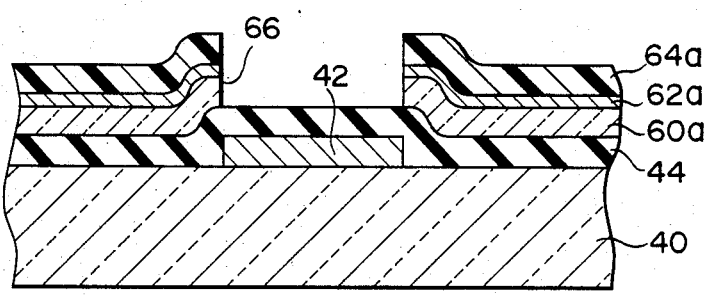

A light 50, e.g., ultraviolet ray is irradiated to the structure of FIG. 4A from the bottom surface side of the transparent substrate 40. Therefore, the negative photoresist film 64 is exposed with the light 50 through the substrate 40, insulating thin-film 44, ITO film 60 and thin-film 62 with the metal thin-film 42 formed on the substrate 40 as a mask pattern. When the above-mentioned structure is thereafter developed, the portion which is not exposed with the light 50 of the negative photoresist film 64 is removed to form a negative resist pattern 64a. With the resist pattern 64a as a mask the amorphous silicon thin-film 62 to which phosphorus is doped and the ITO thin-film 60 are etched. This etched state is shown in FIG. 4B. At this time an opening 66 having a shape corresponding to the profile of the metal thin-film 42 is formed at the thin-films 60a and 62a thus etched.

The remaining negative photoresist film 64a is removed by the known method from the structure of FIG. 4B. One portion 68 of the remaining thin-films 60a and 62a confronting each other through the opening 66 is used, for example, as a source electrode, and the other portion 70 is used as a drain electrode.

Figure 4C:
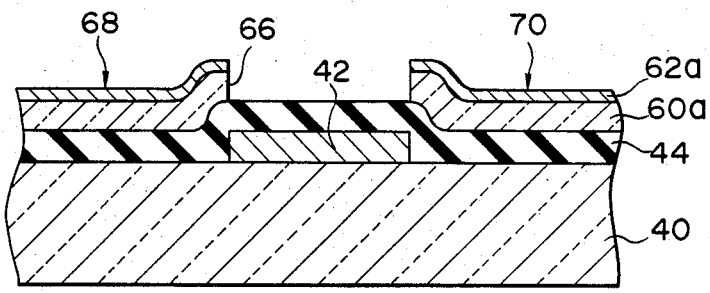
Figure 4D:
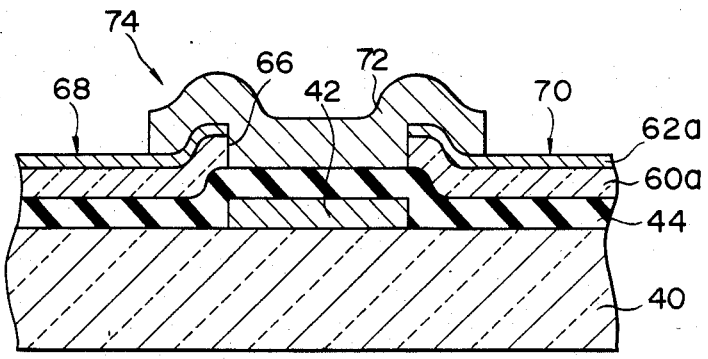

On the top surface including the opening 66 of the structure of FIG. 4C is deposited the amorphous silicon film in a predetermined thickness, e.g., 5,000 Å thick, for example, by a glow discharge decomposition method of SiH₄. This amorphous silicon film is patterned by the known PEP technique to form a semiconductive thin-film 72 as shown in FIG. 4D. Since the following manufacturing process is similar to the known process, the description of the process will be omitted. In this manner the TFT 74 is manufactured.

According to the method for manufacturing the TFTs as another embodiment of the present invention thus constructed, the similar advantages to those of the above-mentioned embodiment can be obtained. Further, according to this embodiment, the amorphous silicon thin-film 62a including low resistance is formed on the top surfaces of the source and drain electrodes 68 and 70 and hence on the ITO film 60a. Accordingly, the ohmic contact of the ITO film 60a with the semiconductive thin-film 72 functioning as the channel of the TFT 74 having electrically bad junction to one another can be improved. Further, since the negative photoresist 64 is coated after the deposition of the low resistive semiconductive film 62 added with an impurity in the method for manufacturing according to the above-mentioned embodiment disclosed with reference to FIGS. 4A to 4D, the yield of manufacturing the TFTs can be improved. Unlike the embodiment of the present invention, in the formation of the low resistive film 62a another method, e.g., a method of lifting off the low resistive thin-film deposited by a known CVD process after the formation of the positive photoresist pattern can be considered. However, according to the other method which employs such the lift-off method, there are problems such as those in which the photoresist material is undesirably hardened due to the generated heat, the low resistive semiconductive thin-film is contaminated and/or the characteristic is deteriorated. In addition, according to the above-mentioned another method, it is difficult to accurately form the cross-sectional shape of the positive photoresist pattern adapted for the lift-off process of the low resistive semiconductive thin-film on the basis of a method of exposing it from the bottom surface side of the transparent substrate. In the method for manufacturing of the above-mentioned embodiment of the present invention, the lift-off method having the aforementioned problems is not employed, and the above-mentioned problems do not accordingly occur. Therefore, the thin-film circuit including a number of TFTs can be readily manufactured in high yield and high integration.

Additionally, according to the above-mentioned another embodiment of the method for manufacturing the TFTs, the thickness of the low resistive amorphous silicon thin-film 62 is selected to approx. 30 to 1,000 Å as described above in FIG. 4A, but this is for the purpose of obtaining preferable ohmic contact. When the ultraviolet light 50 is irradiated from the bottom surface side of the transparent substrate 40, the amorphous silicon thin-film 62 including the thickness of the above-mentioned numeral value has a transmittance which can practically satisfy for the light 50. The spectral sensitivity range of the negative photoresist film 64 for the incident light is ordinarily known to be less than approx. 4,500 Å, and the negative photoresist film 64 could be sensitized in the sufficiently satisfactory contrast by using the amorphous silicon thin-film 62 including the above-mentioned thickness. Therefore, the source and drain electrodes 68 and 70 of the TFT 74 could be accurately self-aligned with the underlying gate electrode 42 and formed.

Although the present invention has been shown and described with respect to particular embodiments, nevertheless, various changes and modifications which are obvious to a person skilled in the art to which the invention pertains are deemed to lie within the spirit, scope, and contemplation of the invention. The amorphous semiconductor material used in the method for manufacturing the TFTs of the present invention is not limited only to the silicon applied in the above-mentioned embodiments, but other substances such as, for example, semiconductor compound, e.g., germanium (Ge) or $Ge_xSi_{1-x}$, $Si_xC_{1-x}$, etc. may be used. In addition, the materials used in the above-mentioned embodiments illustrate only by way of examples, but may be altered in response to the state of the manufacture. For example, the gate insulating film 44 is not limited only to the silicon dioxide ($SiO_2$), but other material such as $Si_3N_4$ may be used. Similarly, the gate electrode 42 may be any of electrically conductive material having opaque property for the incident radiation, e.g., the light 50. Further, if a suitable etching technique is used, indium-oxide or tin-oxide may be used for ITO as material of which the transparent thin-film 60 is formed on the insulating thin-film 44.

In the other embodiment of the present invention disclosed with reference to FIGS. 4A to 4D, the source and drain electrodes 68 and 70 of the TFT 74 are manufactured to include the laminar structure, but are not limited only this, but may be constructed as in the modified embodiment shown, for example, in FIGS. 5A to 5C. In other words, in FIG. 5A, the low resistive amorphous semiconductive thin-film 80 is deposited directly on the gate insulating film 44 deposited on the top surface of the structure made of a substrate 40 and a gate electrode 42. On the thin-film 80 is provided as described above a negative photoresist film 64. When the structure of FIG. 5A is exposed by the light 50, developed and etched in the similar manner to the above-mentioned embodiments, the structure shown in FIG. 5B can be obtained. The amorphous semiconductive thin-film 80a thus etched is self-aligned with the gate electrode 42 on the same reason as that described with reference to the above-mentioned embodiments. Subsequently, as shown in FIG. 5C, electrically conductive thin-films 84 and 86 are formed together with an amorphous semiconductive thin-film 88 functioning as the channel unit. The conductive thin-films 84 and 86 are formed on the above-mentioned low resistive thin-film 80a. The conductive thin-films 84 and 86 are made, for example, of conductive material, e.g., molybdenum, indium or tin oxide. The conductive thin-films 84 and 86 are not contacted with or formed in junction with the channel thin-film 88 directly. The channel thin-film 88 is formed on the predetermined surface region including the opening 82 of the structure of FIG. 5B, and is partly overlaid on the low resistive thin-film 80a. In this manner, the above-mentioned conductive thin-films 84 and 86 are electrically connected only through the low resistive thin-film 80a.

According to the TFT as modified embodiment shown in FIG. 5C, the conductive films 84 and 86 are conplementarily used as the source and drain electrodes and mainly contain low resistive thin-film 80a.

What we claim is:

1. A method for manufacturing a thin-film transistor with a gate layer, and source and drain electrode layers, said method comprising the steps of:

forming a metal film having a predetermined profile on a first surface of an electrically insulative substrate which permits radiation to be transmitted therethrough, said metal film preventing the transmission of radiation and serving as the gate layer;

forming an electrically insulative film on the first surface of said substrate so as to cover the gate metal film, said insulative film being thin enough to allow the transmittance of radiation;

forming an electrically conductive and transparent film on said insulative film;

forming a negative photoresist film on said conductive film;

irradiating radiation from a second surface side opposite the first surface of said substrate to expose said negative photoresist film with said gate metal film being directly used as a mask, thereby forming a shadow of said gate metal film on said negative photoresist film, and then performing an etching process to obtain an electrically conductive film pattern in which an opening, which coincides with said profile of said gate metal film, is formed to define the source and drain electrode layers which are prevented from overlapping said gate metal film and which are self-aligned with said gate metal film; and forming a first semiconductive film on said opening and partially overlapping said source and drain electrode layers, said first semiconductive film serving as a channel region of said transistor.

2. The method according to claim 1, wherein a conductive and transparent film is formed on said insulative film as said conductive film.

3. The method according to claim 1, wherein said negative photoresist film is exposed by ultraviolet radiation incident from the second surface side of said substrate through said substrate, said insulative film and said conductive and transparent film.

4. The method according to claim 1, wherein said method further comprises the steps of:
forming a second semiconductive film having an impurity added thereto on said conductive and transparent film, said second semiconductive film being thin enough to permit the transmission of the transmission of the radiation.

5. The method according to claim 4, wherein said conductive and transparent film and said second semiconductive film are simultaneously etched using the exposed negative photoresist film to be self-aligned with said gate metal film.

6. The method according to claim 5, wherein said first semiconductive film is formed on said opening and partially overlaps the etched second semiconductive film, whereby said etched second semiconductive film is at least partially sandwiched between said first conductive film, and serves as said source and drain electrode layers of said transistor.

7. The method according to claim 6, wherein said second semiconductive film is made of a material selected from the group consisting of polycrystalline semiconductor material and amorphous semiconductor material.

8. The method according to claim 6, wherein said second semiconductive film is made of amorphous semiconductor material and is formed to have a thickness of approximately 30 to 1,000 angstroms.

9. The method according to claim 1, wherein a second semiconductive layer is formed on said insulative layer as said conductive layer, said second semiconductive layer being thin enough to permit the transmission of the radiation.

10. The method according to claim 9, wherein said second semionductive layer is etched using the exposed negative photoresist film to be self-aligned with said gate metal film, thereby obtaining etched second semiconductive layers serving as the source and drain electrode layers.

11. The method according to claim 10, further comprising the step of:
forming on said etched second semiconductive layer additional conductive film serving as auxiliary electrodes for said transistor.

12. A method for manufacturing a thin-film transistor with a gate electrode layer, and source and drain electrode layers, said method comprising the steps of:
forming a metal layer having a predetermined profile on an electrically insulative and transparent substrate permitting the transmission of radiation, said metal layer serving as the gate electrode layer;
sequentially forming on said substrate an insulative layer which is thin enough to permit the transmission of the radiation, a double-layer having a conductive and transparent layer, and a first semiconductor layer which is thin enough to permit the transmission of the radiation, so as to cover said gate electrode layer;
forming a negative photoresist layer on said semiconductor layer;
irradiating the radiation from the substrate side to form a shadow of the gate electrode on said negative photoresist layer with said electrode being directly used as a mask;
performing solvent treatment of said negative photoresist layer to form therein an opening having a shape corresponding to the profile of said gate electrode;
partially etching off said conductive and transparent layer and said semiconductor layer simultaneously by using the negative layer with the opening as a resist mask, thereby forming double-layered source and drain electrodes having substantially no overlap with said gate electrode without using a lift-off techique.

13. The method according to claim 12, further comprising:
forming a second semiconductor layer so as to overlap said source and drain electrodes.

14. The method according to claim 12, wherein said first semiconductor layer is made of a material selected from the group consisting of amorphous semiconductor and polycrystalline semiconductor.

15. The method according to claim 14, wherein said first semiconductor layer comprises an amorphous silicon layer of a thickness ranging from 3 to 100 nanometers.

16. The method according to claim 15, wherein said amorphous silicon layer comprises an impurity added thereto.

* * * * *